(12) United States Patent
Katoh et al.

(10) Patent No.: US 6,490,182 B2
(45) Date of Patent: Dec. 3, 2002

(54) POWER CONVERSION APPARATUS (75) Inventors: Shuji Katoh, Hitachiota (JP); Hiromitsu Sakai, Tokai-mura (JP); Shigeta Ueda, Hitachi (JP); Tomomichi Ito, Hitachi (JP); Hidetoshi Aizawa, Tokai-mura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/972,981

(22) Filed: Oct. 10, 2001

(65) Prior Publication Data

US 2002/0131276 A1 Sep. 19, 2002

(30) Foreign Application Priority Data

Mar. 19, 2001 (JP) ........................................ 2001-077432

(51) Int. Cl.[7] .............................................. H02H 7/122
(52) U.S. Cl. ..................................... 363/56.05; 363/131
(58) Field of Search ........................... 363/16, 56.01, 363/56.03, 56.05, 131, 132

(56) References Cited

U.S. PATENT DOCUMENTS

| 5,926,012 | A | * | 7/1999 | Takizawa et al. | ........... | 323/284 |
| 5,936,387 | A | * | 8/1999 | Tabata et al. | ................ | 323/225 |
| 5,946,208 | A | * | 8/1999 | Yamamoto et al. | ......... | 363/132 |
| 6,064,578 | A | * | 5/2000 | Hashimoto et al. | ........... | 363/16 |
| 6,169,672 | B1 | * | 1/2001 | Kimura et al. | ................ | 363/56 |
| 6,304,472 | B1 | * | 10/2001 | Nagasu et al. | ................ | 363/97 |
| 6,373,731 | B1 | * | 4/2002 | Iwamura et al. | ......... | 363/56.05 |

FOREIGN PATENT DOCUMENTS

JP          10-248237          9/1998

OTHER PUBLICATIONS

"Series Connection of High Voltage IGBT Modules" by M. Bruckmann et al., pp. 1067–1072 Jan. 1998.

* cited by examiner

Primary Examiner—Adolf Deneke Berhane
(74) Attorney, Agent, or Firm—Crowell & Moring LLP (57) ABSTRACT A semiconductor electric power converter in accordance with the present invention comprises an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in of series is connected to a load. Thereby the impedance between the gate terminal of the IGBT and the gate circuit is decreased when the gate voltage is higher than the gate voltage command value or the impedance between the gate and the emitter of the IGBT is decreased when the collector voltage is high so that an electric charge stored in the gate is rapidly discharged.

22 Claims, 9 Drawing Sheets

POWER CONVERSION APPARATUS

BACKGROUND OF THE INVENTION

The present invention relates to a semiconductor electric power converter which uses semiconductor elements and the like and more particularly relates to a semiconductor electric power converter which suppresses overvoltage during a switching operation.

In an IGBT power converter, when an IGBT is turned off, the energy stored in a line while the IGBT has been on becomes a surge voltage and is applied to said IGBT. Japanese Application Patent Laid-open Publication No. Hei.10-248237 has disclosed a method of preventing elements from being damaged due to the application of overvoltage including a surge voltage generated when an IGBT is turned off. This method employs a capacitor connected between a gate and a collector of the IGBT to suppress a voltage rise rate (dv/dt) of the collector.

Figure 2:
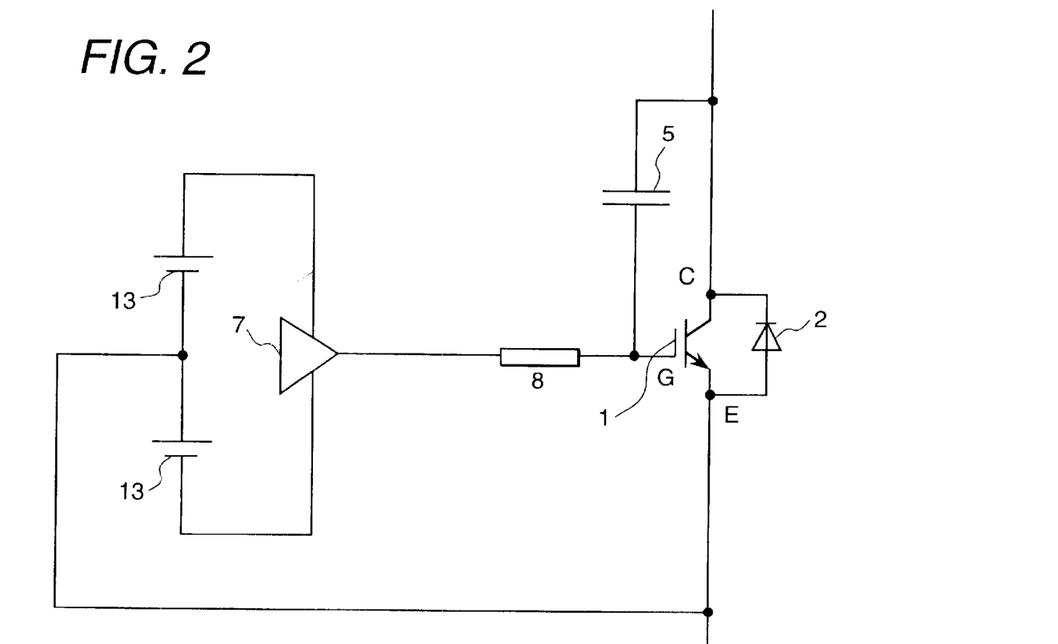
FIG. 2 shows the main part of one arm of a power converter in accordance with the prior art.

Normally, to turn off an IGBT, a switch that connects a gate terminal and a negative potential line of a gate circuit is closed. When a switch located between a gate terminal and a negative potential line of a gate circuit is closed, an electric charge that has been charged in the gate is drawn to the gate circuit and a gate voltage is decreased. As a gate voltage decreases, a collector voltage increases and the IGBT enters into the OFF state from the ON state. If a capacitor is connected between the IGBT collector and the gate thereof, a current is supplied to the gate in proportion to dv/dt of the collector voltage. This restrains a decrease in gate voltage or increases a gate voltage, thus decreasing the dv/dt of the collector voltage and protecting the collector from the application of overvoltage. FIG. 2 illustrates the main part of one arm of a power converter in accordance with the prior art.

SUMMARY OF THE INVENTION

If a dv/dt of the collector voltage is high, an excessive gate current is supplied by a capacitor connected between a collector and an emitter of an IGBT, which excessively increases a gate voltage and decreases the impedance of the IGBT more than necessary. This excessive decrease in impedance of the IGBT results in increasing unnecessary turn-off loss. Further, when a collector voltage decreases due to an excessive supply of gate current, said capacitor draws the gate current from the IGBT gate and a gate voltage rapidly decreases. As a gate voltage rapidly decreases, a collector voltage quickly increases, which causes the collector voltage and gate voltage vibration problems.

In view of the foregoing, the main purpose of the present invention is to provide a power converter which employs a circuit that prevents the collector voltage from vibrating and also prevents the application of overvoltage to the collector by minimizing an increase in loss of the IGBT.

A semiconductor electric power converter in accordance with the present invention comprises a capacitor which is connected between a collector and a gate of an IGBT and means for immediately discharging an electric charge from the gate when a gate voltage increases more than a gate voltage command value specified in response to the collector voltage. This configuration allows the semiconductor electric power converter in accordance with the present invention to control an appropriate gate voltage, which prevents the collector voltage from vibrating and also minimizes an increase in loss of the IGBT to clamp the collector voltage.

A semiconductor electric power converter in accordance with the present invention employs means for immediately discharging an electric charge stored in a gate when a gate voltage exceeds a gate voltage command value specified in response to the collector voltage. The means include means for decreasing the impedance between a gate terminal and a gate circuit of the IGBT and means for decreasing the impedance between the gate and an emitter when a collector voltage has been increased.

In a semiconductor electric power converter in accordance with the present invention, a capacitor connected between a collector and a gate of an IGBT supplies a gate current to the IGBT gate to increase the gate voltage when a dv/dt of the collector voltage is high. This protects the IGBT from the application of overvoltage. Further, in a semiconductor electric power converter in accordance with the present invention, when a gate voltage of an IGBT is higher than a gate voltage command value specified in response to the collector voltage, the impedance between either the gate and the gate circuit or between the gate and the emitter is decreased so that a current supplied by the capacitor connected between the collector and the emitter can be bypassed due to the impedance between either the gate and the gate circuit or between the gate and the emitter. This prevents an excessive increase in gate voltage and also prevents an excessive decrease in impedance of the IGBT.

DESCRIPTION OF THE PREFERRED EMBODIMENTS

Preferred embodiments of the present invention will be described in detail below referring to drawings. In the drawings shown below, the same referenced numerals are assigned to the same functions. In addition, the electric potential of an emitter is used as reference. In conditions where overvoltage is applied between a collector and an emitter of an IGBT, a voltage appearing between the collector and the emitter and a voltage appearing between the collector and the gate are almost equivalent. Therefore, both voltages are thereinafter referred to as "collector voltage".

In the embodiments shown below, if an IGBT is replaced with another MOS control semiconductor device, such as a MOSFET, the same effect can be expected.

Embodiment 1

Figure 1:
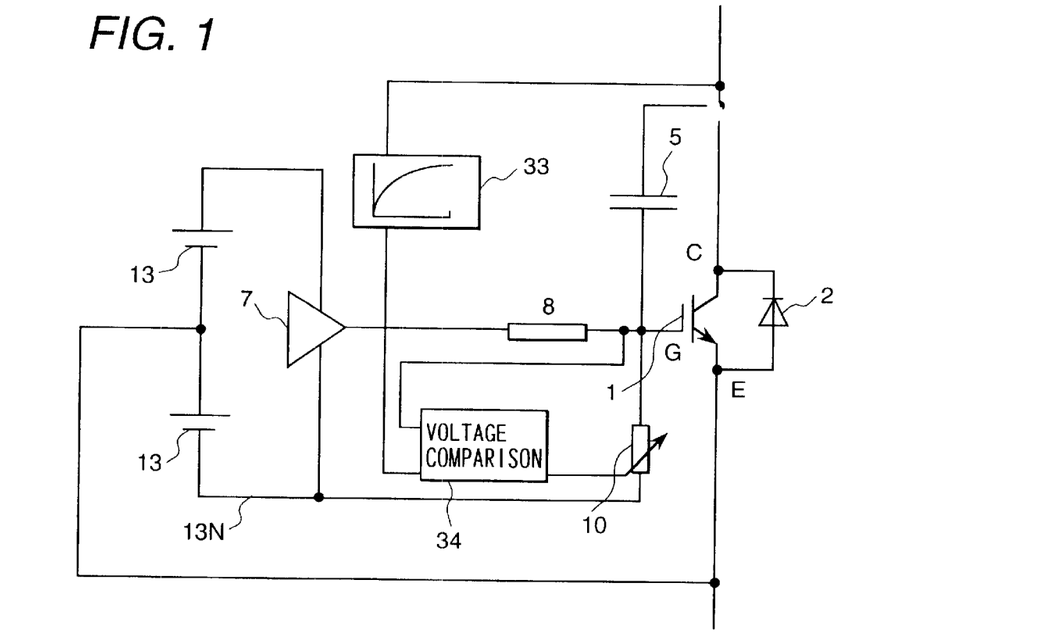
FIG. 1 shows the main part of one arm of a power converter which is a first embodiment of the present invention.
Figure 3:
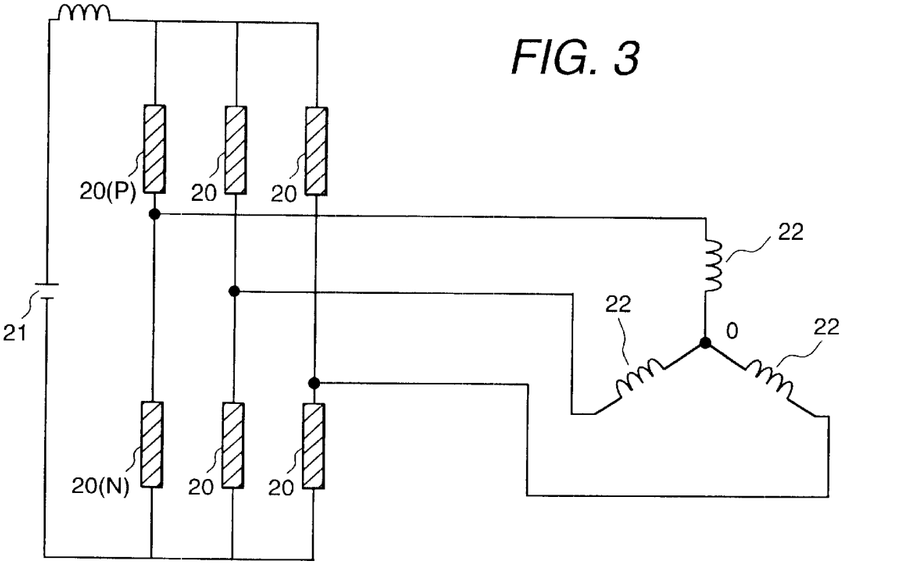
FIG. 3 shows the main part of one arm of a power converter which is a first embodiment of the present invention.

Configuration of a power converter which is a first embodiment of the present invention will be described in detail below referring to FIGS. 1 and 3. FIG. 3 illustrates the main part of a power converter which is a first embodiment of the present invention. FIG. 1 illustrates the main part of an arm 20 shown in FIG. 3. Configuration of the arm 20 will be described in the following. A reflux diode 2 is connected inversely in parallel with an IGBT 1. Further, an ON-OFF pulse generator 7 that generates switching command ON-OFF signals is connected to a gate terminal of the IGBT 1 via a gate resistor 8. Power is supplied to the ON-OFF pulse generator 7 from a power source 13. A capacitor 5 is connected between a collector terminal and a gate terminal of the IGBT 1. A controllable impedance 10 is connected between the gate terminal of the IGBT 1 and a line 13N in a driver. A gate voltage of the IGBT 1 and a gate voltage command value 33 specified in response to the collector voltage are input into a voltage comparison means 34. When a gate voltage of the IGBT 1 exceeds a gate voltage command value 33 specified in response to the collector voltage, the voltage comparison means 34 outputs a signal to decrease the impedance of the controllable impedance 10.

In a power converter shown in FIG. 3, two arms 20 that are connected in series are connected in parallel with two other sets of two arms that are connected in series, and each arm is connected to a DC voltage source 21. Each midpoint of the paired arms is connected to a load 22.

Next, operation of a power converter which is a first embodiment of the present invention will be described. As shown in FIG. 1, power required for operating the pulse generator 7 is supplied from the power source 13 and the pulse generator 7 generates drive signals for PWM control or PAM control. The generated drive signals are input into the gate of the IGBT via the gate resistor 8 and turn on and off the IGBT 1. This turns on and off the arm 20 shown in FIG. 3 to produce an AC voltage and apply the AC voltage to the load 22. Here, said drive signals do not turn on the paired arms, for example, an arm 20(P) and an arm 20(N) shown in FIG. 3, at the same time.

Let us focus on the state where an ON drive signal is sent to an arm 20(P) and an OFF drive signal is sent to an arm 20(N) while the arm 20(N) and arm 20(P) are alternately turning on and off. When the arm 20(P) is turned on, a current flows from the DC voltage source 21 to the arm 20(P) and to an inductance load 22. When the arm 20(P) is turned off, a voltage generated in a wiring inductance 23 located on the route of the main circuit (DC voltage source 21 to arm 20(P) to arm 20(N) to DC voltage source 21) is superimposed on a voltage of the DC voltage source 21. As a result, a voltage appearing between the collector and the emitter of the IGBT 1 which consists of the arm 20(P) rapidly increases.

Figure 15:
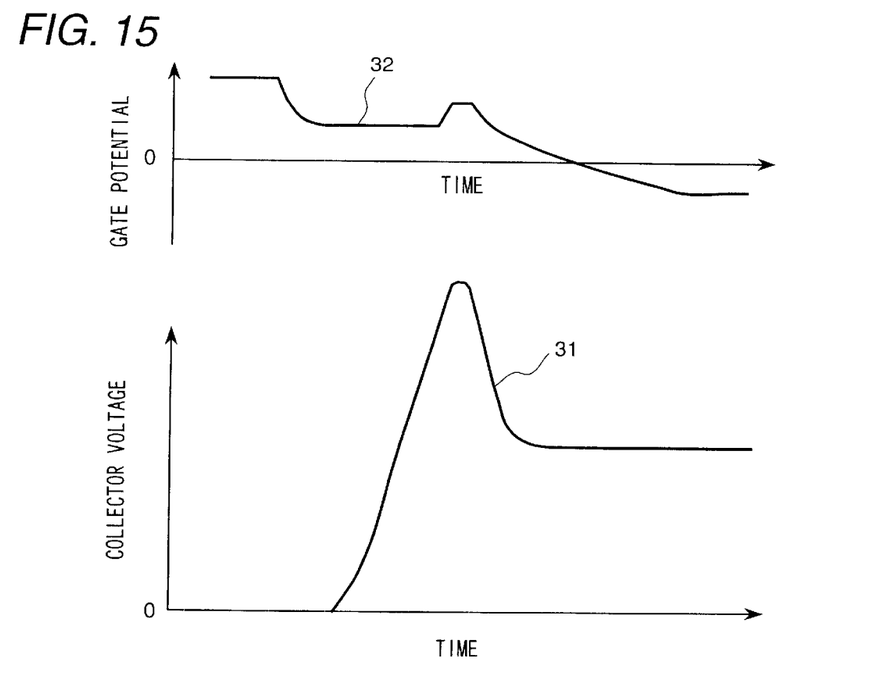
FIG. 15 is an explanatory drawing that shows the gate potential and the collector voltage of the IGBT of a first embodiment.

Next, the collector voltage and the gate voltage waveform at the time of the IGBT being off will be described in detail with reference to FIG. 15. While the IGBT is turned on, if an OFF signal is generated from the pulse generator 7, which means that a negative electric potential is output from the pulse generator 7, an electric charge stored in the gate of the IGBT 1 is drawn through the gate resistor 8. This turns off the IGBT 1 and increases a collector voltage 31 as shown in FIG. 15. When a collector voltage 31 increases, the capacitor 5 supplies a current in proportion to a voltage rise rate (dv/dt) to the gate of the IGBT 1. Accordingly, a gate voltage 32 increases and the dv/dt of the collector voltage 31 can be suppressed. When an electric potential of the gate of the IGBT 1 becomes higher than a gate potential command value 33 (FIG. 16) specified in response to the collector voltage, the impedance of the controllable impedance 10 is decreased and a current supplied by the capacitor 5 is bypassed so that the gate of the IGBT 1 can be prevent from being overcharged.

Figure 4:
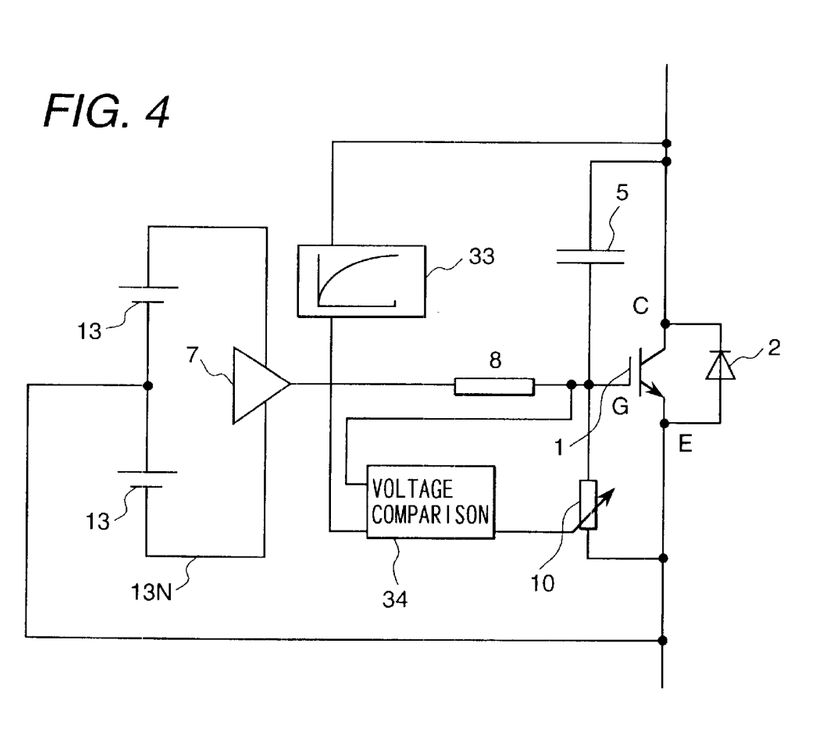
FIG. 4 shows the main part of one arm of a power converter which is a first embodiment of the present invention.

As described above, this embodiment prevents an excessive decrease in collector voltage and an unnecessary increase in turn-off loss. In FIG. 1, a controllable impedance 10 is connected between a gate terminal of the IGBT 1 and a line 13N in a driver. However, if the controllable impedance 10 is connected between the gate terminal and the emitter terminal of the IGBT 1 as shown in FIG. 4, the same effect can be expected.

Figure 16:
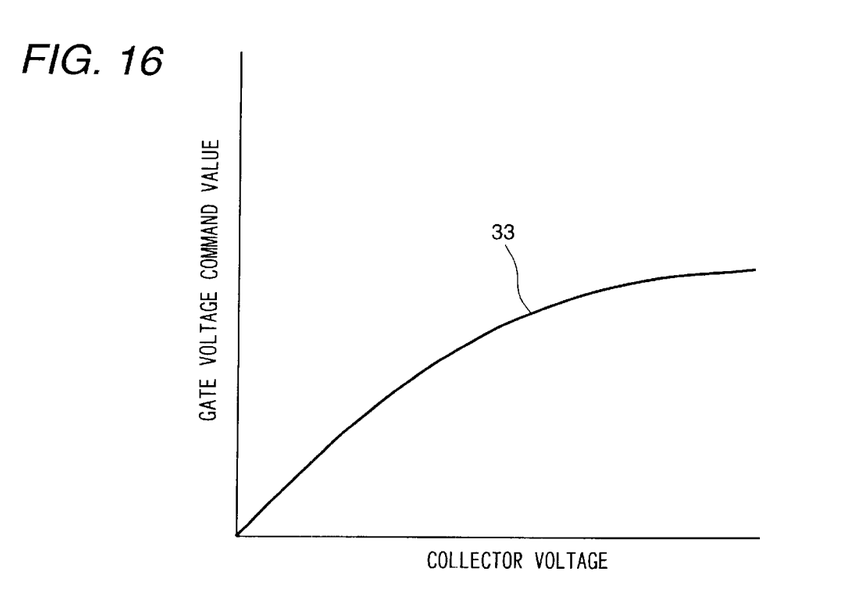
FIG. 16 is an explanatory drawing that shows the collector voltage and the gate voltage command value of the IGBT of a first embodiment.

A relationship between a collector voltage and a gate command value are not necessarily the same as that shown in FIG. 16. As a whole, if the gate voltage becomes higher as the collector voltage becomes higher, the settings are applicable.

In order to further decrease a loss of the IGBT and more securely protect the IGBT from the application of overvoltage, the settings should be as follows: the gate voltage command value is set to be slightly lower than the gate threshold of the IGBT when a voltage appearing between the collector and the emitter of the IGBT reaches a voltage (FIG. 3) which is obtained by dividing a voltage of the voltage source 21 by the number of IGBT series consisting of an arm 2; and also the gate voltage command value is set at a voltage which is nearly equivalent to a voltage of the voltage source 13 when the collector voltage is close to the breakdown voltage of the element.

Embodiment 2

Figure 5:
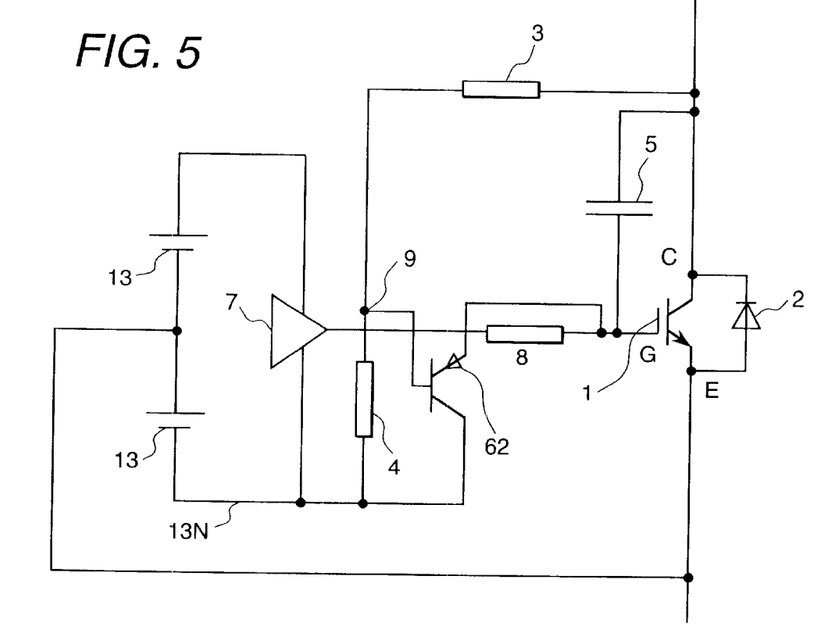
FIG. 5 shows the main part of one arm of a power converter which is a second embodiment of the present invention.
Figure 6:
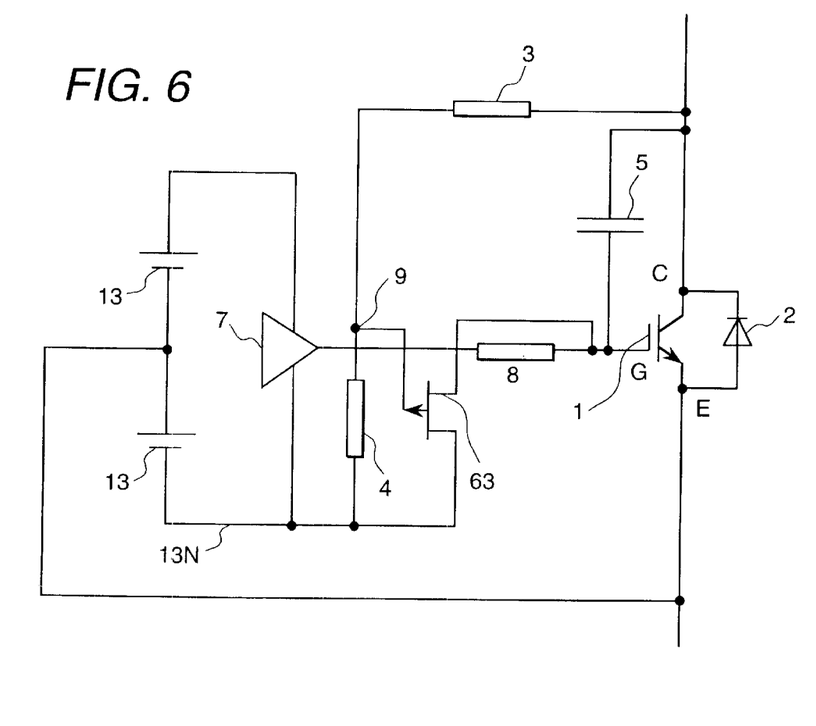
FIG. 6 shows the main part of one arm of a power converter which is a second embodiment of the present invention.

In a second embodiment, an arm 20 which is illustrated in FIG. 3 of a first embodiment is configured as shown in FIG. 5 and the collector voltage of an IGBT 1 is divided by resistors 3 and 4. When a gate potential of the IGBT 1 becomes higher than the electric potential of a voltage dividing point 9, a transistor 62 becomes conductive to bypass a current supplied by a capacitor 5. Accordingly, this embodiment prevents the gate of the IGBT 1 from being overcharged and also prevents an excessive decrease in collector voltage and an unnecessary increase in turn-off loss. The transistor 62 in this embodiment corresponds to a controllable impedance 10 in a first embodiment. If the transistor 62 in FIG. 5 is replaced with a FET 63 or a MOSFET 64 as shown in FIG. 6 or FIG. 7, the same effect can be expected.

Embodiment 3

Figure 7:
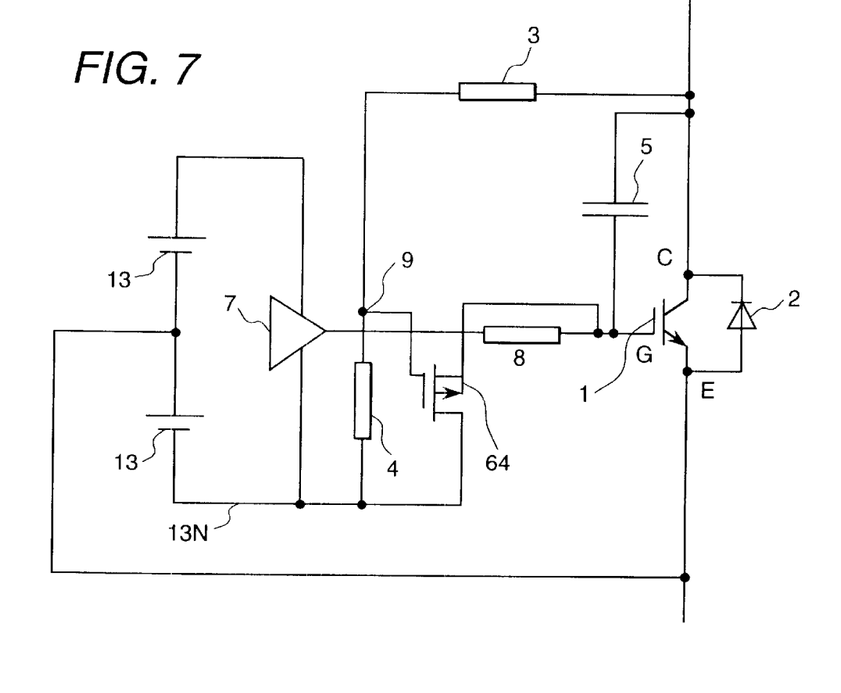
FIG. 7 shows the main part of one arm of a power converter which is a second embodiment of the present invention.
Figure 8:
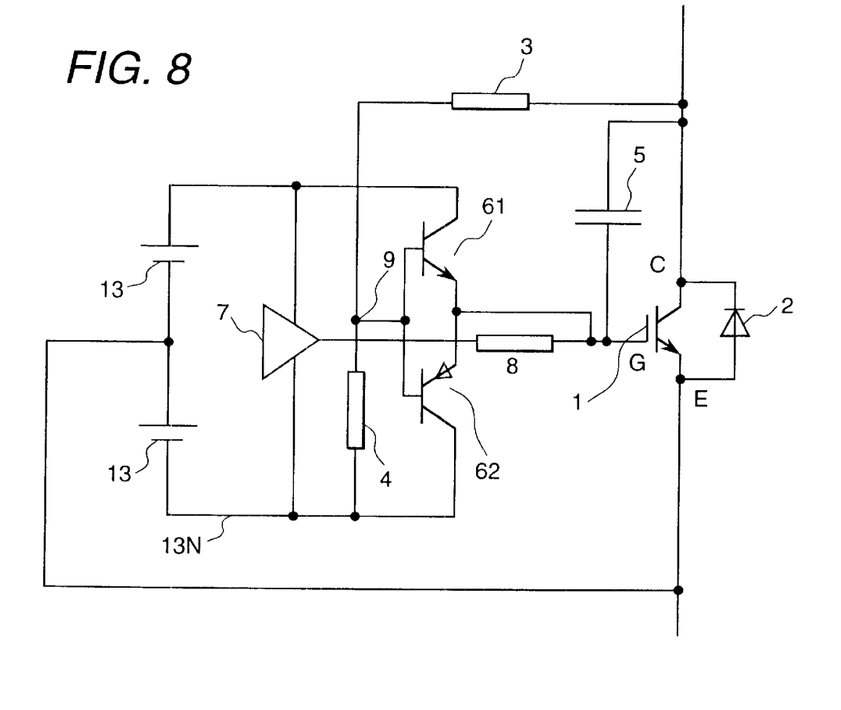
FIG. 8 shows the main part of one arm of a power converter which is a third embodiment of the present invention.

In a third embodiment, a power converter's arm 20 which is illustrated in FIG. 3 of a first embodiment is configured as shown in FIG. 7 and therein a transistor 61 is added to the circuit shown in FIG. 4. The transistor 61 is turned on when a gate potential of an IGBT 1 is lower than the electric potential of a voltage dividing point 9. That is to say, if a collector voltage of the IGBT 1 becomes too high, a current is supplied to the gate of the IGBT 1 via the transistor 61. This embodiment supplies current to the gate of the IGBT 1 mainly from a capacitor 5 when a dv/dt of the collector voltage of the IGBT 1 is high and via the transistor 61 when the dv/dt is low. Consequently, it is possible to prevent the application of overvoltage to an IGBT collector.

If the gate potential of the IGBT 1 becomes higher than the electric potential of the voltage dividing point 9, the transistor 62 becomes conductive to bypass a current supplied by the capacitor 5 in the same manner as a second embodiment. Accordingly, it is possible to prevent the gate of the IGBT 1 from being overcharged and also to prevent an excessive decrease in collector voltage and an unnecessary increase in turn-off loss.

Embodiment 4

Figure 9:
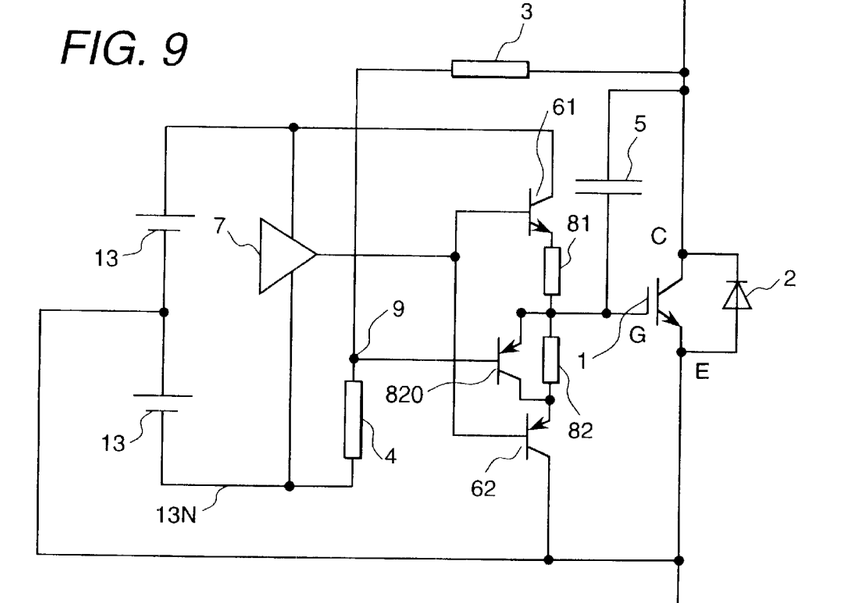
FIG. 9 shows the main part of one arm of a power converter which is a fourth embodiment of the present invention.

In a fourth embodiment, a power converter's arm 20 which is illustrated in FIG. 3 of a first embodiment is configured as shown in FIG. 9. Transistors 61 and 62 in FIG. 9 amplify a current flowing through an ON-OFF signal generation circuit 7. Gate resistors 81 and 82 are connected to each transistor. When an IGBT 1 is turned off, a pulse generator 7 outputs a negative electric potential, which turns on the transistor 62. The collector voltage of the IGBT 1 is divided by resistors 3 and 4. When the electric potential of the IGBT 1 becomes higher than that of a voltage dividing point 9, a transistor 820 becomes conductive to bypass a current supplied by a capacitor 5 through a low impedance route via transistors 820 and 62. Accordingly, this embodiment prevents the gate of the IGBT 1 from being overcharged and also prevents an excessive decrease in collector voltage and an unnecessary increase in turn-off loss. The transistor 820 corresponds to a controllable impedance 10 in a first embodiment.

Figure 10:
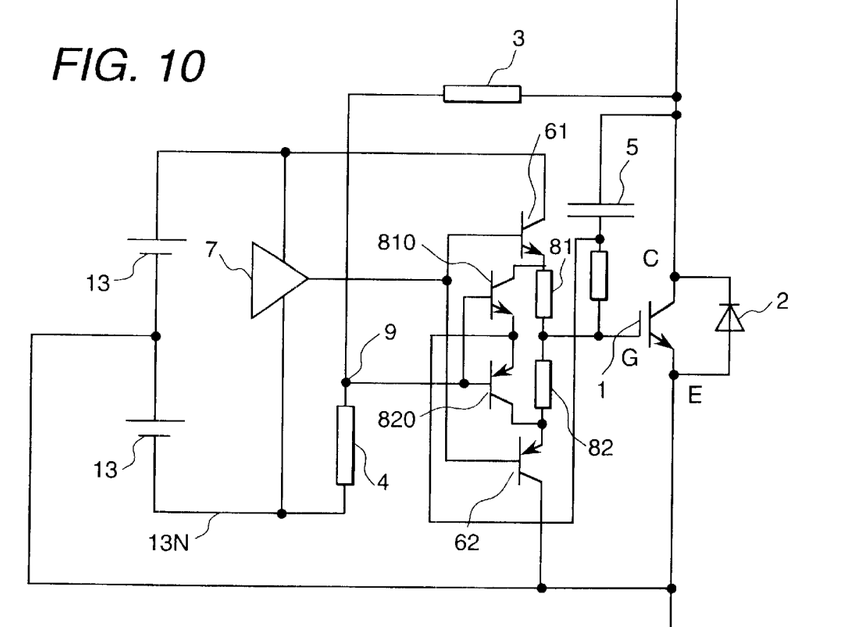
FIG. 10 shows the main part of one arm of a power converter which is a fourth embodiment of the present invention.
Figure 11:
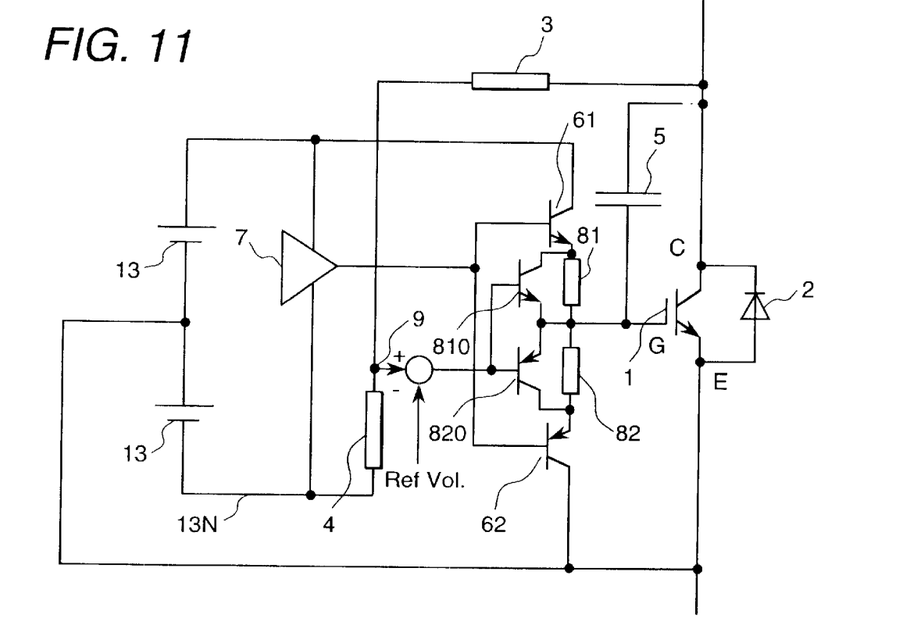
FIG. 11 shows the main part of one arm of a power converter which is a fourth embodiment of the present invention.

Further, as shown in FIG. 10, if a transistor 810 is connected in parallel with an ON gate resistor 81, a current supplied to the gate can be bypassed when overvoltage is applied to the collector of the IGBT 1. This makes it possible to more securely prevent the application of overvoltage. Furthermore, as shown in FIG. 11, if transistors 810 and 820 are controlled by a voltage difference between the electric potential of the voltage dividing point 9 and a reference voltage, the same effect can be expected.

Embodiment 5

Figure 12:
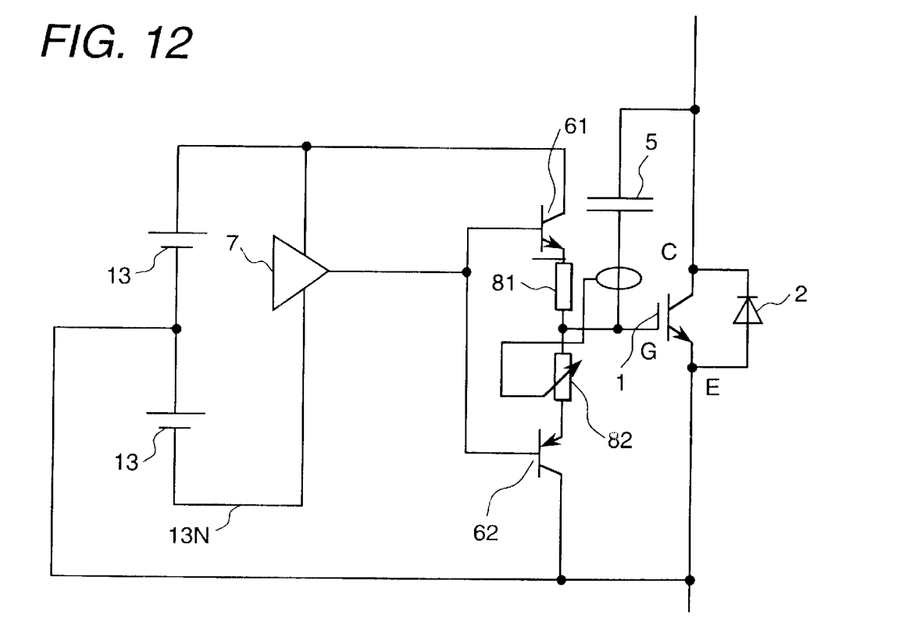
FIG. 12 shows the main part of one arm of a power converter which is a fifth embodiment of the present invention.

In a fifth embodiment, a power converter's arm 20 which is illustrated in FIG. 3 of a first embodiment is configured as shown in FIG. 12. If a gate of an IGBT 1 is overcharged and a collector voltage decreases, a current flowing through a capacitor 5 is inverted. Therefore, a current flowing through the capacitor 5 is monitored and when the current flow shifts and starts to flow from the gate to the collector of the IGBT 1, the impedance of a gate resistor 82 decreases and an electric charge of the overcharged gate is quickly drawn. As a consequence, it is possible to prevent the gate of the IGBT 1 from being overcharged and also to prevent an excessive decrease in collector voltage and an unnecessary increase in turn-off loss. The gate resistor 82 corresponds to a controllable impedance 10 in a first embodiment 1.

Embodiment 6

Figure 13:
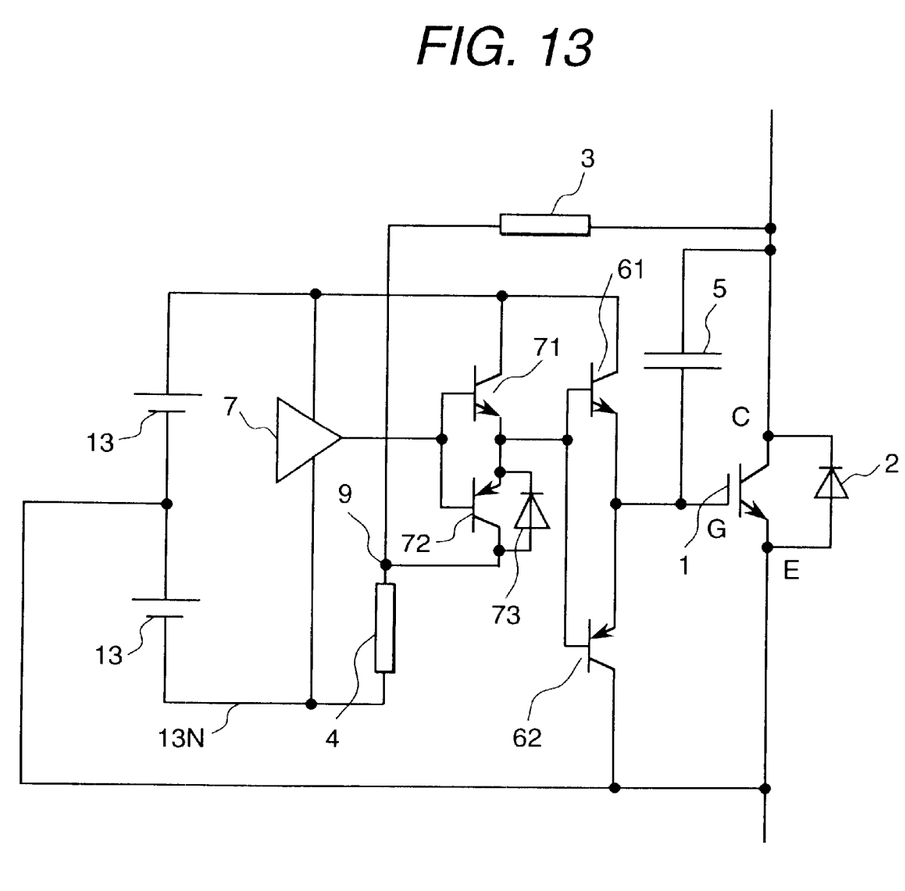
FIG. 13 shows the main part of one arm of a power converter which is a sixth embodiment of the present invention.

In a sixth embodiment, a power converter's arm 20 which is illustrated in FIG. 3 of a first embodiment is configured as shown in FIG. 13. Transistors 71 and 72 and a diode 73 are connected to an output side of an ON-OFF signal generation circuit 7 and the transistor 72 and the diode 73 are connected to a voltage dividing point 9. The transistors 71 and 72 and diode 73 compare the electric potential of the ON-OFF signal generation circuit 7 with that of the voltage dividing point 9 and output a higher electric potential to transistors 61 and 62. When a collector voltage of an IGBT 1 is high, the base potential of the transistors 61 and 62 is also high. Therefore, the transistor 61 turns on and the transistor 62 turns off. Consequently, the gate of the IGBT 1 supplies a current from a capacitor 5 and the transistor 61 to suppress dv/dt of the IGBT and prevent the application of overvoltage. When the gate is overcharged, the transistor 61 turns off and the transistor 62 turns on, which rapidly discharges an electric charge stored in the gate of the IGBT 1 via the transistor 62. This makes it possible to prevent the gate of the IGBT 1 from being overcharged and also to prevent an excessive decrease in collector voltage and an unnecessary increase in turn-off loss. The transistor 62 corresponds to a controllable impedance 10 in a first embodiment.

Embodiment 7

Figure 14:
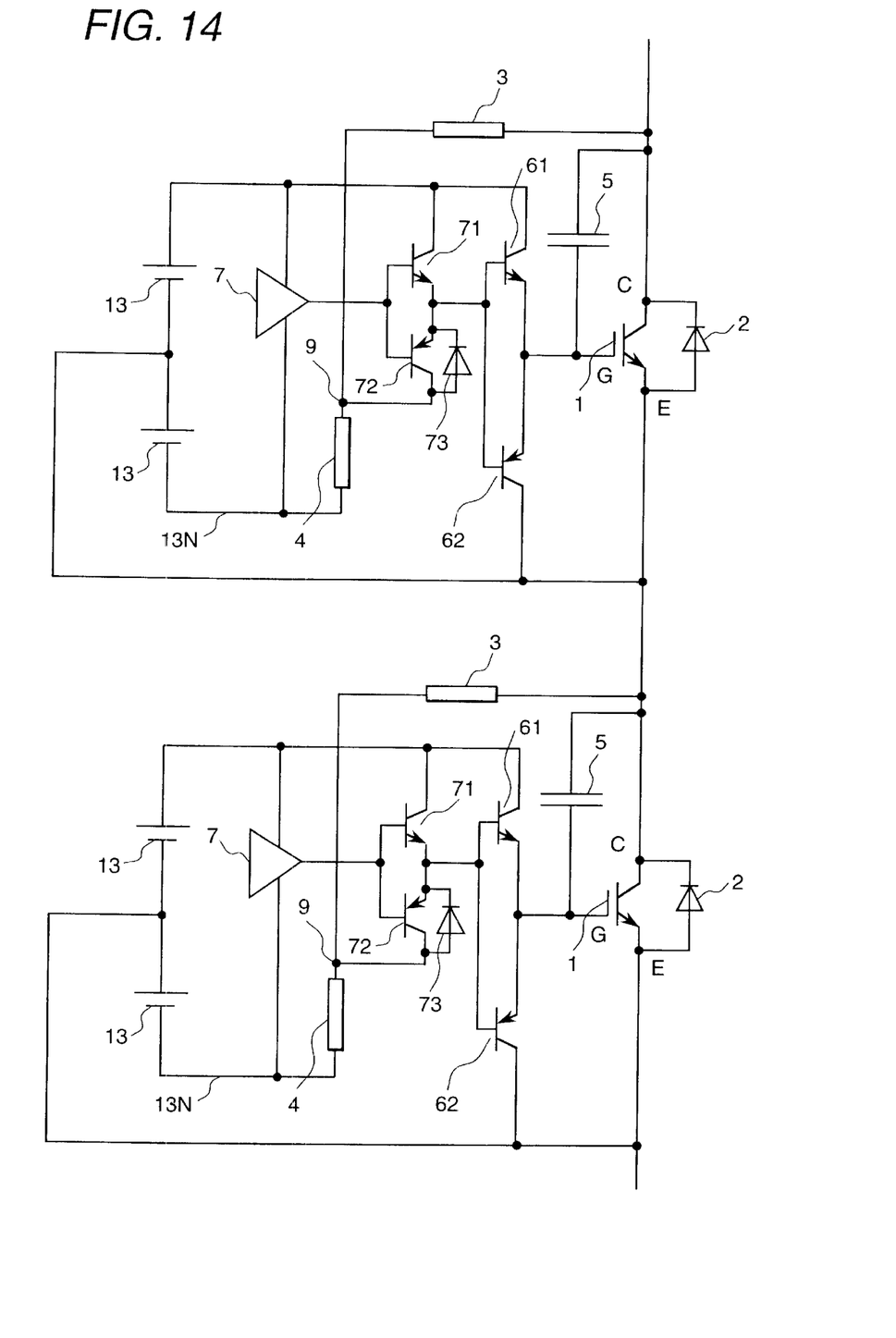
FIG. 14 shows the main part of one arm of a power converter which is a seventh embodiment of the present invention.

In a seventh embodiment, an arm shown in FIG. 3 consists of circuits which are shown in said FIG. 1, FIG. 4 through FIG. 13 and are connected in series. FIG. 14 shows an example. This embodiment suppresses dv/dt of the collector voltage of an IGBT 1 and also restrains overvoltage. Consequently, an electric potential between a collector and an emitter of the IGBT 1 connected in series can easily maintain equilibrium.

What is claimed is:

1. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising a controllable impedance connected between the gate of said IGBT and a line of said gate circuit, wherein the impedance of said controllable impedance is decreased to discharge an electric charge stored in the gate when the gate voltage of said IGBT is higher than the gate voltage command value specified in response to the collector voltage of said IGBT.

2. A semiconductor electric power converter according to claim 1, wherein said arm consists of two IGBTs connected in series.

3. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising a controllable impedance connected between the gate of said IGBT and a negative potential line of said gate circuit, wherein the impedance between the gate of said IGBT and the negative potential line of said gate circuit is decreased when the gate voltage of said IGBT is higher than the gate voltage command value specified in response to the collector voltage of said IGBT.

4. A semiconductor electric power converter according to claim 3, wherein said arm consists of two IGBTs connected in series.

5. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising a controllable impedance connected between the gate and an emitter of said IGBT, wherein the impedance between the gate and the emitter of said IGBT is decreased when the gate voltage of said IGBT is higher than the gate voltage command value specified in response to the collector voltage of said IGBT.

6. A semiconductor electric power converter according to claim 5, wherein said arm consists of two IGBTs connected in series.

7. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising a controllable impedance connected between the gate of said IGBT and a negative potential line of said gate circuit and means for dividing the collector voltage of said IGB, wherein an electric charge stored in the gate of said IGBT is discharged when the gate potential is higher than the electric potential of the voltage dividing point executed by said voltage dividing means.

8. A semiconductor electric power converter according to claim 7, wherein an electric charge stored in the gate is discharged when the gate voltage is higher than the voltage of the voltage dividing point executed by said voltage dividing means.

9. A semiconductor electric power converter according to claim 7, wherein said arm consists of two IGBTs connected in series.

10. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising a controllable impedance connected between the gate of said IGBT and a negative potential line of said gate circuit and means for dividing the collector voltage of said IGB, wherein the impedance between the gate of said IGBT and the negative potential line of said gate circuit is decreased when the gate potential is higher than the electric potential of the voltage dividing point executed by said voltage dividing means.

11. A semiconductor electric power converter according to claim 10, wherein said arm consists of two IGBTs connected in series.

12. A semiconductor electric power converter according to claim 8, wherein said arm consists of two IGBTs connected in series.

13. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising means for dividing the collector voltage of said IGB, wherein a gate current is drawn to a negative potential line of said gate circuit by bypassing a gate resistor that restrains the gate current when the gate potential is higher than the electric potential of the voltage dividing point executed by said voltage dividing means.

14. A semiconductor electric power converter according to claim 13, wherein said arm consists of two IGBTs connected in series.

15. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising means for dividing the collector voltage of said IGB, wherein means for supplying a gate current to the gate is provided by bypassing a resistor that restrains charging current of the gate when the gate potential of said IGBT is lower than the electric potential of the voltage dividing point executed by said voltage dividing means, and a gate current is drawn to a negative potential line of said gate circuit by bypassing a resistor that restrains discharging current of the gate when the gate potential is higher than the electric potential of the voltage dividing point executed by said voltage dividing means.

16. A semiconductor electric power converter according to claim 15, wherein said arm consists of two IGBTs connected in series.

17. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising means for dividing the collector voltage of said IGB, wherein a circuit is provided for discharging an electric charge stored in the gate of said IGBT when the electric potential of the voltage dividing point executed by said voltage dividing means is higher than a prescribed value.

18. A semiconductor electric power converter according to claim 17, wherein said arm consists of two IGBTs connected in series.

19. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising a circuit for discharging an electric charge stored in the gate of said IGBT when a current flows from the gate of said IGBT to the direction for charging said capacitor.

20. A semiconductor electric power converter according to claim 19, wherein said arm consists of two IGBTs connected in series.

21. A semiconductor electric power converter having an arm consisting of an IGBT, a capacitor connected between a collector and a gate of said IGBT, and a gate circuit connected to the gate of said IGBT for controlling the switching operation of said IGBT, wherein a plurality of said arms connected in series are connected in parallel and each midpoint of said arms connected in series is connected to a load, said semiconductor electric power converter comprising means for dividing the collector voltage of said IGB and means for comparing the voltage of the voltage dividing point executed by said voltage dividing means with the voltage for commanding switching operation of said IGBT and controlling the gate voltage to utilize a higher voltage.

22. A semiconductor electric power converter according to claim 21, wherein said arm consists of two IGBTs connected in series.

* * * * *